United States Patent
Mor et al.

(10) Patent No.: US 9,460,970 B2
(45) Date of Patent: Oct. 4, 2016

(54) CONTROL FIN HEIGHTS IN FINFET STRUCTURES

(71) Applicant: Taiwan Semiconductor Manufacturing Company, Ltd., Hsin-Chu (TW)

(72) Inventors: Yi-Shien Mor, Hsin-Chu (TW); Hsiao-Chu Chen, Caotun Township (TW); Mu-Chi Chiang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/609,180

(22) Filed: Jan. 29, 2015

(65) Prior Publication Data

US 2015/0155208 A1 Jun. 4, 2015

Related U.S. Application Data

(62) Division of application No. 14/132,299, filed on Dec. 18, 2013, now Pat. No. 8,975,698, which is a division of application No. 13/351,135, filed on Jan. 16, 2012, now Pat. No. 8,659,097.

(51) Int. Cl.

| | | |
|---|---|---|
| *H01L 21/84* | (2006.01) | |
| *H01L 27/12* | (2006.01) | |
| *H01L 29/66* | (2006.01) | |
| *H01L 29/78* | (2006.01) | |
| *H01L 27/088* | (2006.01) | |
| *H01L 21/8234* | (2006.01) | |

(52) U.S. Cl.
CPC ..... *H01L 21/845* (2013.01); *H01L 21/823431* (2013.01); *H01L 27/0886* (2013.01); *H01L 27/1211* (2013.01); *H01L 29/66795* (2013.01); *H01L 29/785* (2013.01); *H01L 29/7848* (2013.01)

(58) Field of Classification Search
None
See application file for complete search history.

(56) References Cited

U.S. PATENT DOCUMENTS

| | | | |
|---|---|---|---|
| 6,867,433 B2 | 3/2005 | Yeo et al. | |
| 7,635,893 B2 | 12/2009 | Weis et al. | |
| 7,923,337 B2 | 4/2011 | Chang et al. | |
| 7,989,855 B2 | 8/2011 | Narihiro | |
| 8,106,459 B2 | 1/2012 | Chang et al. | |
| 8,263,462 B2 | 9/2012 | Hung et al. | |
| 8,362,572 B2 | 1/2013 | Huang et al. | |
| 8,373,238 B2 | 2/2013 | Lee et al. | |
| 2004/0217420 A1 | 11/2004 | Yeo et al. | |
| 2005/0218438 A1* | 10/2005 | Lindert | H01L 29/66795 257/296 |
| 2007/0096182 A1 | 5/2007 | Schloesser et al. | |
| 2007/0241414 A1 | 10/2007 | Narihiro | |
| 2008/0142891 A1* | 6/2008 | Booth | H01L 29/7851 257/365 |
| 2008/0315309 A1 | 12/2008 | Chang et al. | |
| 2009/0032887 A1 | 2/2009 | Jang et al. | |
| 2009/0302372 A1 | 12/2009 | Chang et al. | |
| 2011/0037129 A1 | 2/2011 | Yu et al. | |
| 2011/0049599 A1 | 3/2011 | Taketani | |
| 2011/0068407 A1 | 3/2011 | Yeh et al. | |
| 2011/0121406 A1 | 5/2011 | Lee et al. | |

(Continued)

*Primary Examiner* — Matthew Reames
*Assistant Examiner* — Steven B Gauthier
(74) *Attorney, Agent, or Firm* — Slater Matsil, LLP

(57) ABSTRACT

A device includes a substrate, an isolation region at a top surface of the substrate, and a semiconductor fin over the isolation region. The semiconductor fin has a fin height smaller than about 400 Å, wherein the fin height is measured from a top surface of the semiconductor fin to a top surface of the isolation region.

20 Claims, 13 Drawing Sheets

(56) References Cited

U.S. PATENT DOCUMENTS

| | | |
|---|---|---|
| 2011/0133292 A1 | 6/2011 | Lee et al. |
| 2011/0147811 A1 | 6/2011 | Kavalieros et al. |
| 2011/0147848 A1 | 6/2011 | Kuhn et al. |
| 2011/0244668 A1 | 10/2011 | Narihiro |
| 2011/0260257 A1* | 10/2011 | Jagannathan ....... H01L 27/0924 257/369 |
| 2012/0026781 A1 | 2/2012 | Pacha et al. |
| 2012/0043611 A1 | 2/2012 | Mouli et al. |
| 2012/0083107 A1 | 4/2012 | Chang et al. |
| 2012/0217587 A1 | 8/2012 | Wang |
| 2012/0223396 A1 | 9/2012 | Berthold et al. |
| 2012/0241818 A1 | 9/2012 | Kavalieros et al. |
| 2012/0306082 A1 | 12/2012 | Sekar et al. |
| 2012/0313227 A1 | 12/2012 | Or-Bach et al. |
| 2012/0319211 A1 | 12/2012 | van Dal et al. |
| 2013/0011983 A1 | 1/2013 | Tsai et al. |
| 2013/0011984 A1 | 1/2013 | Wang et al. |
| 2013/0017680 A1 | 1/2013 | Haran et al. |
| 2013/0020612 A1 | 1/2013 | Wann et al. |
| 2013/0023093 A1 | 1/2013 | Lin et al. |
| 2013/0056826 A1 | 3/2013 | Liu et al. |
| 2013/0082329 A1 | 4/2013 | Chen et al. |
| 2014/0061815 A1 | 3/2014 | Jagannathan et al. |
| 2014/0097495 A1 | 4/2014 | Pillarisetty et al. |
| 2014/0138742 A1 | 5/2014 | Wann et al. |

* cited by examiner

CONTROL FIN HEIGHTS IN FINFET STRUCTURES

This application is a divisional of U.S. patent application Ser. No. 14/132,299 entitled, "Control Fin Heights in FinFET Structures," filed Dec. 18, 2013 which is a divisional of U.S. patent application Ser. No. 13/351,135, entitled "Control Fin Heights in FinFET Structures," filed on Jan. 16, 2012, now U.S. Pat. No. 8,659,097 issued Feb. 25, 2014, which application are incorporated herein by reference.

BACKGROUND

With the increasing down-scaling of integrated circuits and increasingly demanding requirements to the speed of integrated circuits, transistors need to have higher drive currents with smaller dimensions. Fin Field-Effect Transistors (FinFET) were thus developed. FinFET transistors have increased channel widths. The increase in the channel widths is achieved by forming channels that include portions on the sidewalls of the fins and portions on the top surfaces of the fins. Since the drive currents of transistors are proportional to the channel widths, the drive currents of FinFETs are increased.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A Fin Field-Effect Transistor (FinFET) related structure and the method of forming the same are provided in accordance with various embodiments. The intermediate stages of forming the FinFET are illustrated. The variations of the embodiments are discussed. Throughout the various views and illustrative embodiments, like reference numbers are used to designate like elements.

Figure 1:
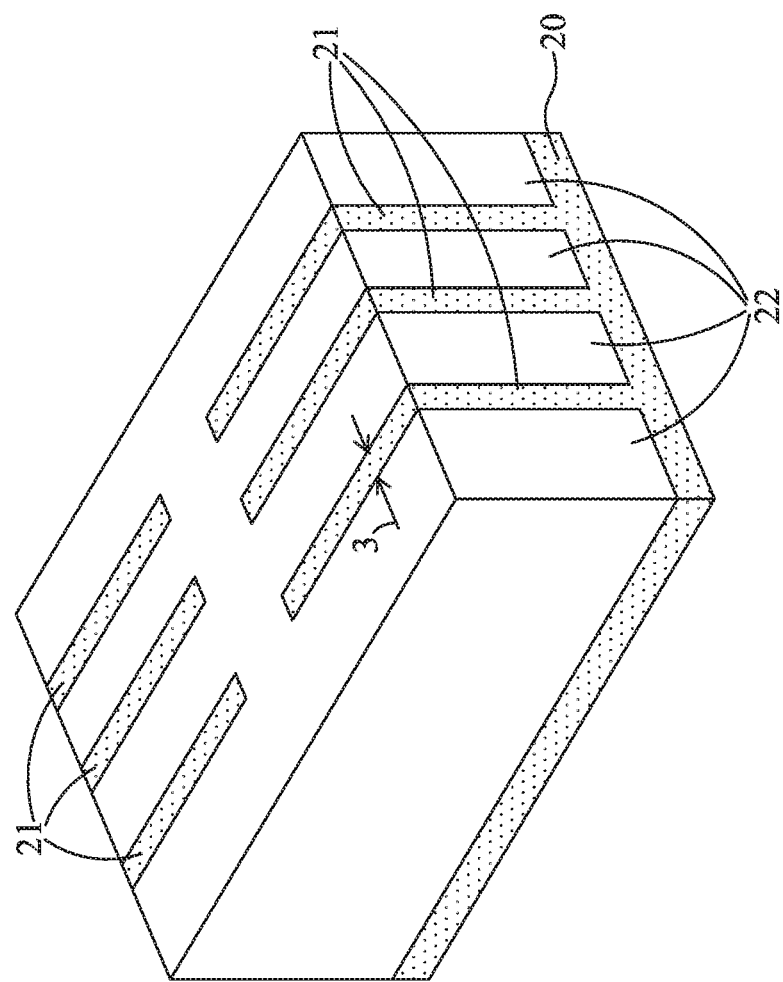
FIGS. 1 through 7 are cross-sectional views and perspective views of intermediate stages in the manufacturing of a Fin Field-Effect Transistor (FinFET) related structure in accordance with various exemplary embodiments.

FIGS. 1 through 7 are cross-sectional views and perspective views of intermediate stages in the manufacturing of a FinFET-related structure in accordance with some exemplary embodiments. FIG. 1 illustrates a perspective view of an initial structure. The initial structure includes substrate 20. Substrate 20 may be a semiconductor substrate, which may further be a silicon substrate, a silicon germanium substrate, a silicon carbon substrate, or a substrate formed of other semiconductor materials. Substrate 20 may be doped with a p-type or an n-type impurity. Isolation regions such as Shallow Trench Isolation (STI) regions 22 may be formed in substrate 20. Width W of STI region 22 may be smaller than about 500 Å, and may be smaller than about 50 Å. The portions of substrate 20 between neighboring STI regions 22 form semiconductor strips 21.

Figure 2:
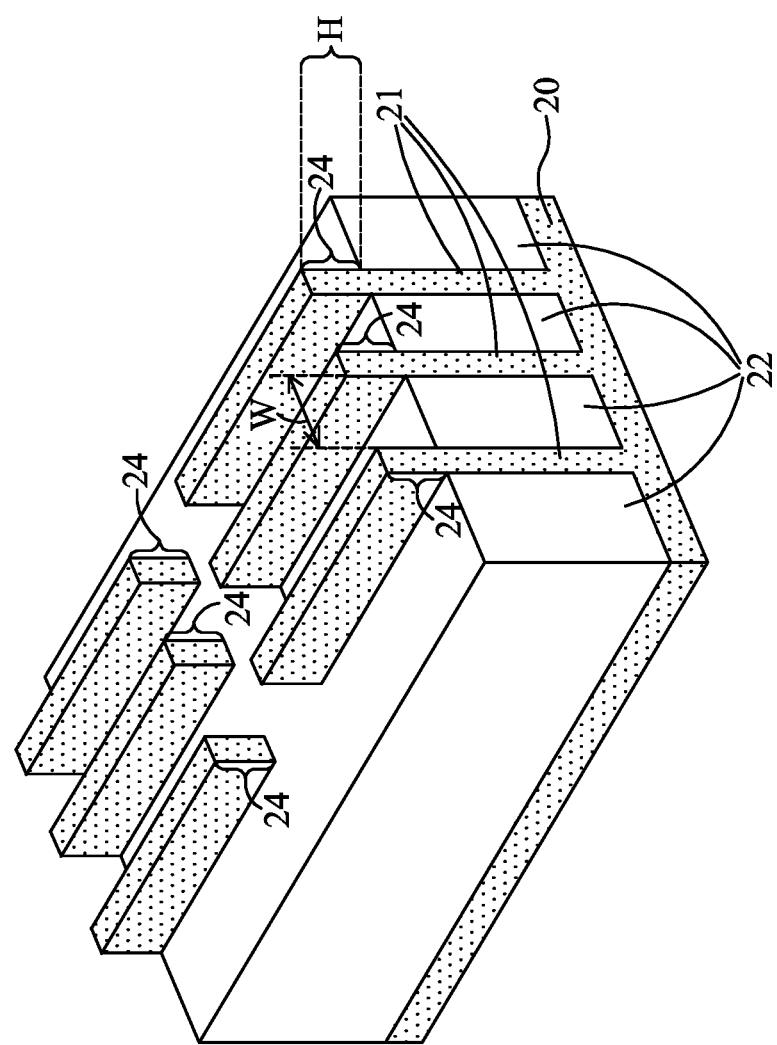

Referring to FIG. 2, STI regions 22 are recessed through an etching step. Portions of semiconductor strips 21 are thus over the top surfaces of the remaining STI regions 22. The portions of semiconductor strips 21 over the top surfaces of the remaining STI regions 22 are referred to as semiconductors fins 24 hereinafter. Semiconductor fins 24 thus have STI regions 22 therebetween, and edges of semiconductor fins 24 are substantially aligned to edges of the corresponding STI regions 22. In some embodiments, height H of fin 24 is smaller than about 400 Å, and may be smaller than about 250 Å. The portions of semiconductor strips 21 that are under semiconductor fins 24 have edges contacting the edges of STI regions 22. Furthermore, semiconductor strips 21 and semiconductor fins 24 may be formed of a same semiconductor material.

Figure 3A:
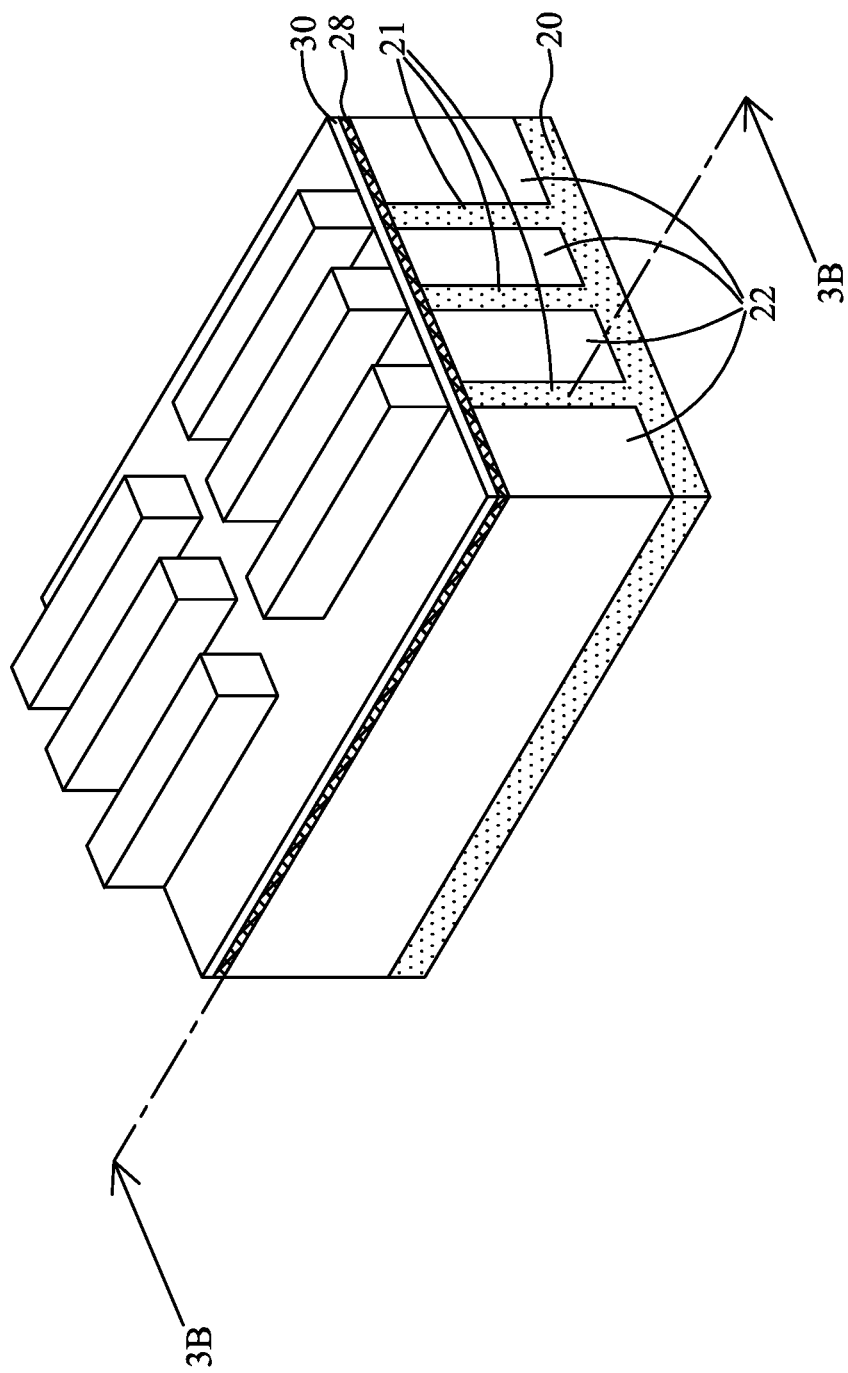
Figure 3B:
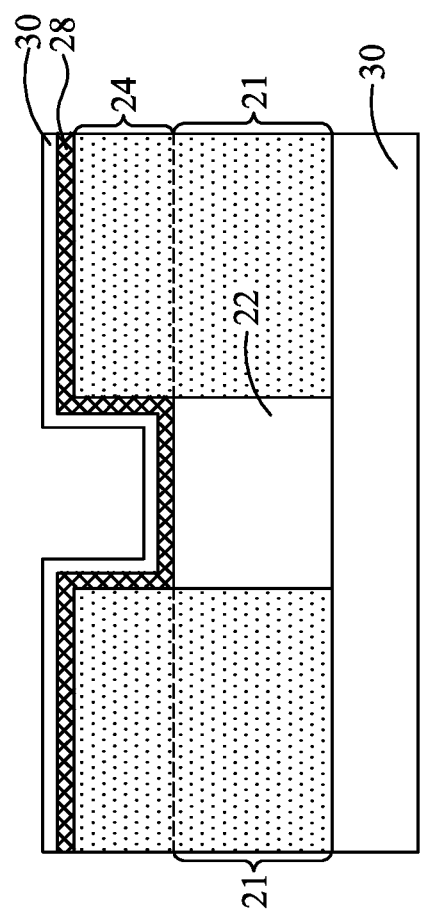

Referring to FIGS. 3A and 3B, dielectric layer 28 is formed on the top surfaces and sidewalls of fins 24. FIG. 3A illustrates a perspective view. FIG. 3B illustrates a cross-sectional view obtained from the plane crossing line 3B-3B in FIG. 3A. In accordance with some embodiments, dielectric layer 28 comprises silicon oxide, silicon nitride, or multilayers thereof. In alternative embodiments, dielectric layer 28 is formed of a high-k dielectric material, and hence is alternatively referred to as high-k dielectric layer 28 throughout the description. High-k dielectric layer 28 may have a k value greater than about 7.0, and may include an oxide or a silicate of Hf, Al, Zr, La, Mg, Ba, Ti, Pb, and combinations thereof. Exemplary materials of high-k dielectric layer 28 include $MgO_x$, $BaTi_xO_y$, $BaSr_xTi_yO_z$, $PbTi_xO_y$, $PbZr_xTi_yO_z$, and the like, with values X, Y, and Z being between 0 and 1. One skilled in the art will realize, however, that the dimensions recited throughout the specification are examples, and may be changed to different values. The formation methods of dielectric layer 28 may include Molecular-Beam Deposition (MBD), Atomic Layer Deposition (ALD), Physical Vapor Deposition (PVD), and the like.

Over dielectric layer 28, capping layer 30 is formed. In some embodiments, capping layer 30 may be a metal-containing layer, and hence may sometimes be referred to as metal layer 30. Capping layer 30 may comprise titanium nitride (TiN) in accordance with some embodiments. In alternative embodiments, the exemplary materials of capping layer 30 include tantalum-containing materials and/or titanium-containing materials such as TaC, TaN, TaAlN, TaSiN, TiN, TiAl, Ru, and combinations thereof.

Figure 4A:
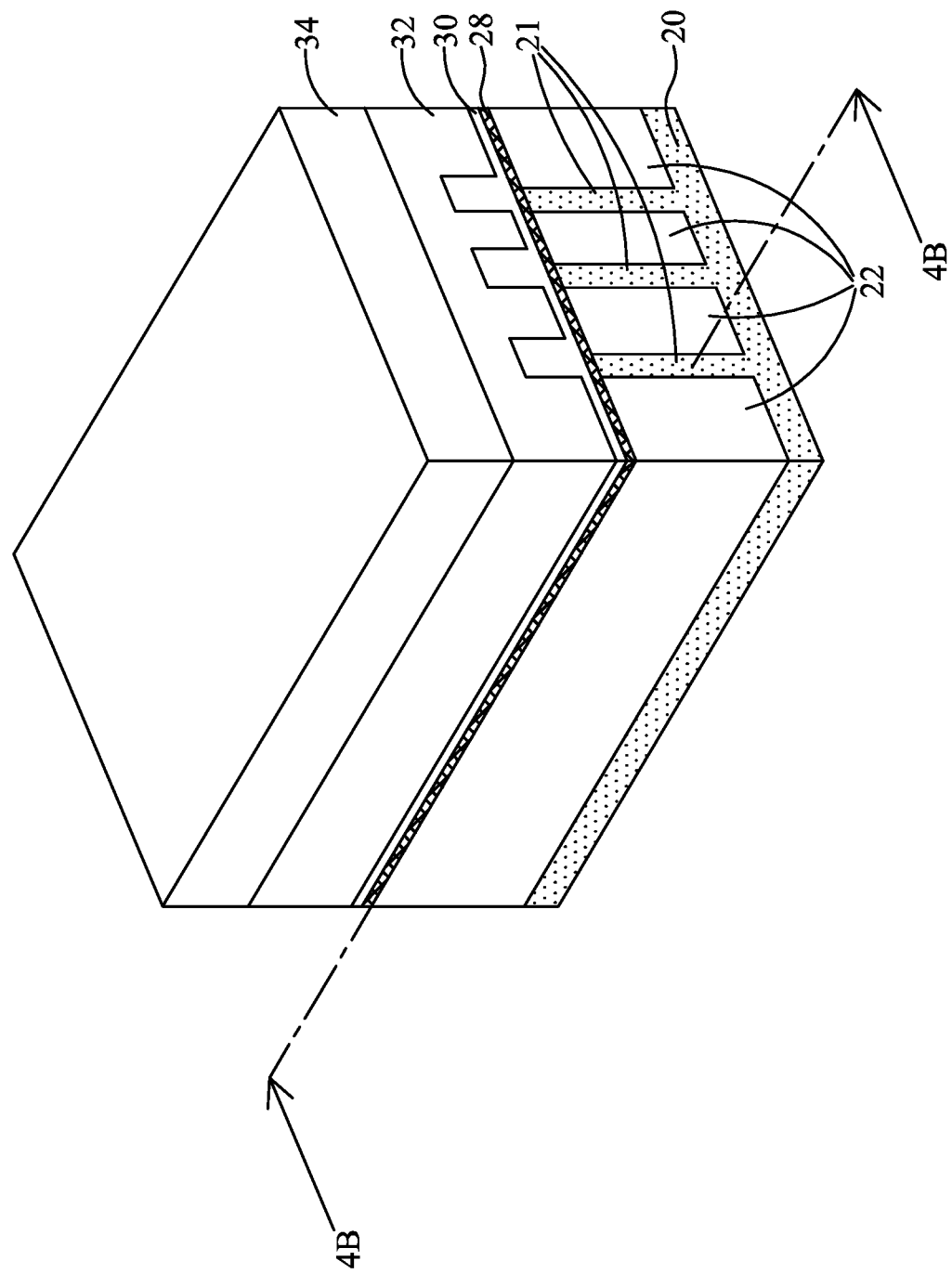
Figure 4B:
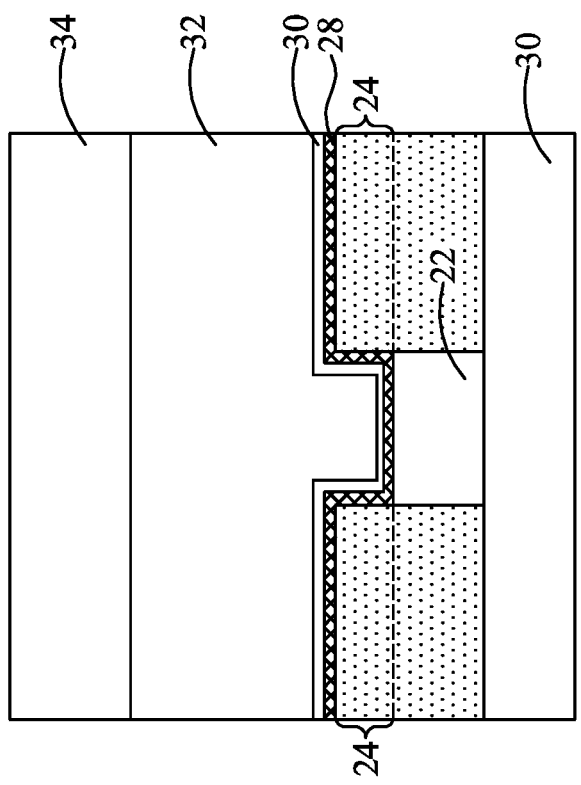

FIGS. 4A and 4B illustrate a perspective view and a cross-sectional view, respectively, of the formation of polysilicon layer 32 and hard mask layer 34. The cross-sectional view shown in FIG. 4B is obtained from the plane crossing line 4B-4B in FIG. 4A. First, polysilicon layer 32 is deposited, followed by a Chemical Mechanical Polish (CMP) to level the top surface of polysilicon layer 32. Hard mask layer 34 is then formed over polysilicon layer 32. Hard mask layer 34 may be formed of silicon nitride, for example, although other materials such as silicon oxide may also be used.

Figure 5:
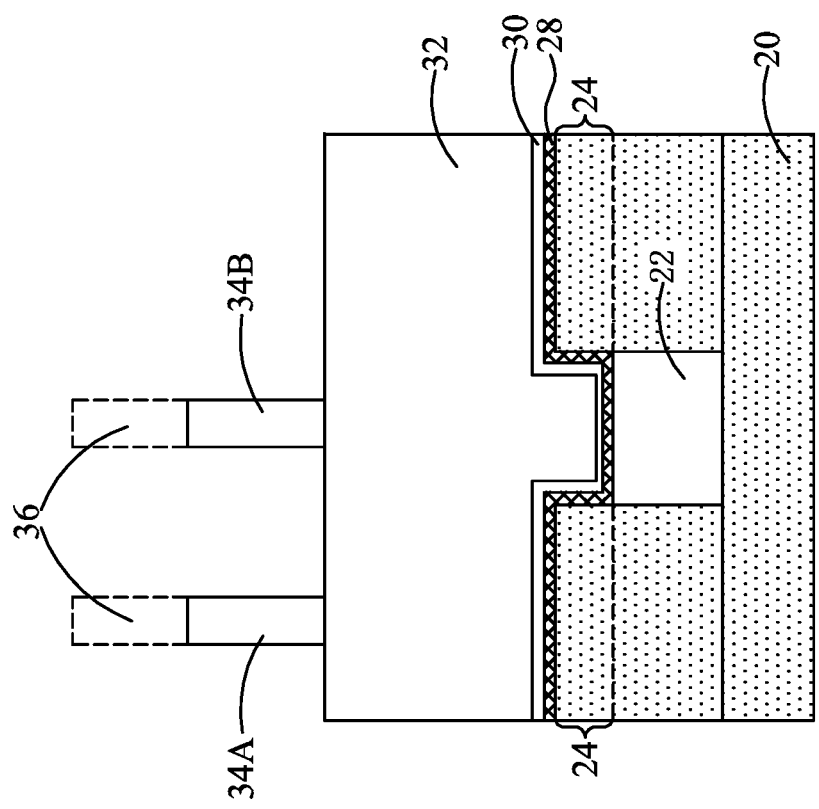

In FIG. 5, hard mask layer 34 is patterned, and the remaining portions of hard mask layer 34 comprise hard mask patterns 34A and 34B. To pattern hard mask layer 34, photo resist 36 may be formed and patterned first, and the patterned photo resist 36 is then used as an etching mask to pattern hard mask layer 34. The patterned photo resist 36 is then removed. Hard mask pattern 34A is over a portion of fin 24, and hard mask pattern 34B is over a portion of STI region 22.

Figure 6A:
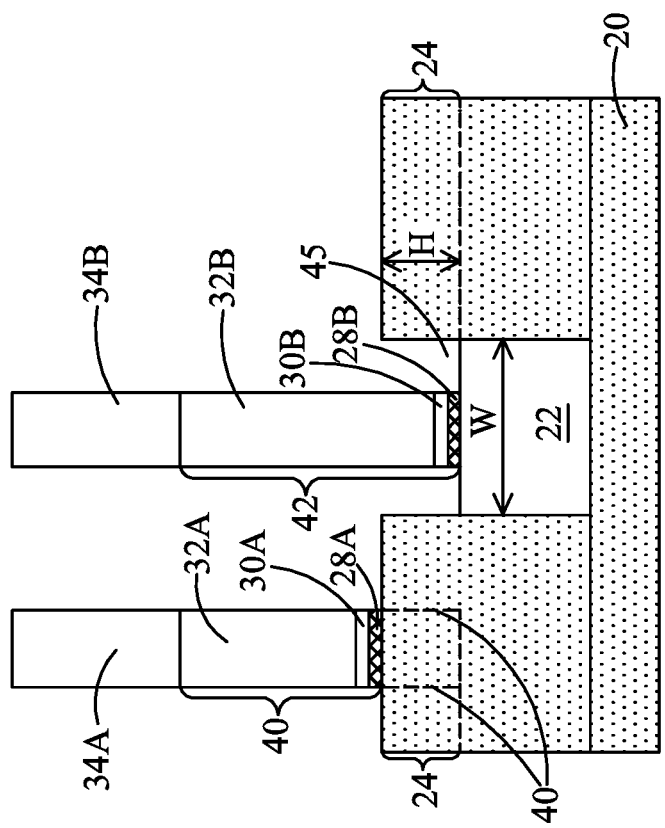
Figure 6B:
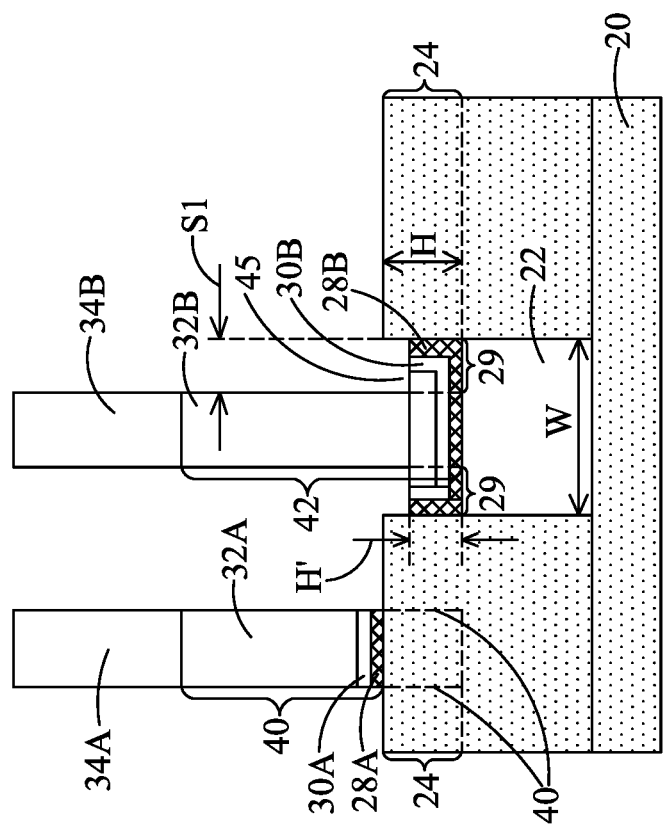

Next, as shown in FIG. 6A, hard mask patterns 34A and 34B are used as etching masks to etch the underlying polysilicon layer 32, capping layer 30, and dielectric layer 28. As a result, gate stack 40 is formed over fin 24, and stacked layers 42 are formed over STI region 22. Gate stack 40 comprises polysilicon layer 32A, metal layer 30A, and dielectric layer 28A. Stacked layers 42 comprise polysilicon layer 32B, metal layer 30B, and dielectric layer 28B. Gate stack 40 may also be formed on the sidewalls of fin 24, as indicated by dashed lines. In some embodiments, there are substantially no residue of gate dielectric layer 28, metal layer 30, and polysilicon layer 32 left on the sides of stacked layers 42, and the edges of polysilicon layer 32B, metal layer 30B, and dielectric layer 28B may be substantially straight and vertical, and may be substantially aligned to each other. In some situations, however, the residues of gate dielectric layer 28, metal layer 30, and polysilicon layer 32 may be undesirable left over STI region 22. The resulting structure is illustrated in FIG. 6B. It was found that whether the residues are formed or not formed may be affected by fin height H of fins 24. When fin height H is smaller than about 400 Å, the residues were not form. When fin height H is greater than about 400 Å, however, the residues start to be formed, and the greater the fin height H is, the more residue may be found. The residues are schematically illustrated as 29 in FIG. 6B. In accordance with some embodiments, to form the residue-free structure, fin height H may be smaller than about 400 Å, and may further be smaller than about 250 Å. In the embodiments, by controlling the fin height to smaller than a critical value of 250 Å, the residues of gate dielectric layer 28, metal layer 30, and the polysilicon layer 32 may be substantially eliminated from over STI region 22.

Figure 8:
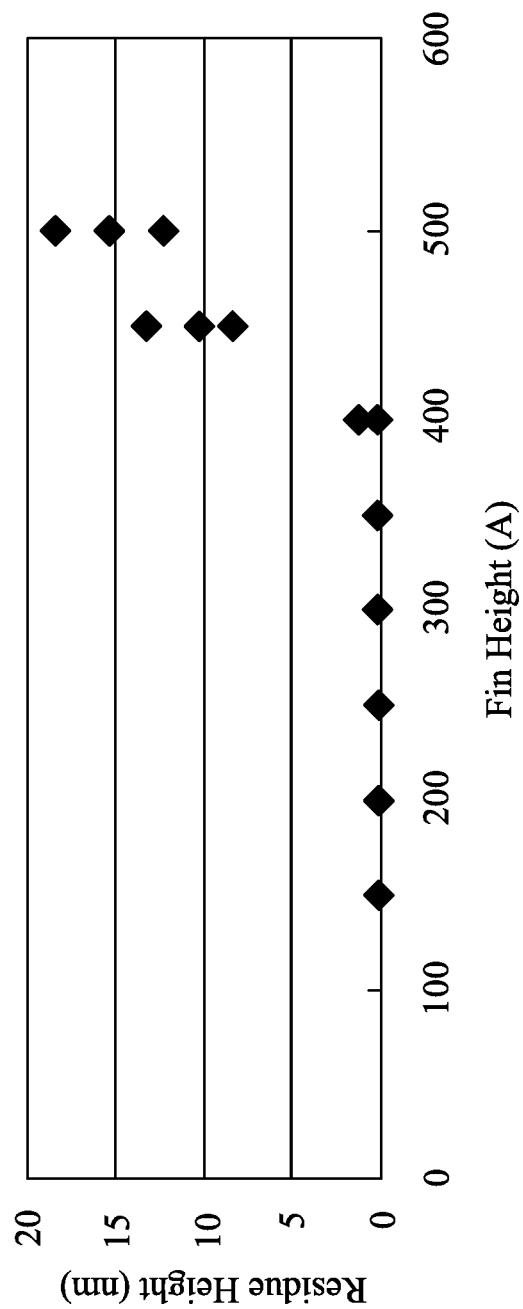
FIGS. 8 and 9 illustrate experiment results.

Experiment results indicated that fin height H has a significant effect on the amount of residue remaining in trench 45. FIG. 8 illustrates the experiment result obtained from sample wafers, wherein height H' (FIG. 6) of the residues in trench 45 is illustrated as a function of fin height H. Trench 45 is a portion of the space that is over the recessed STI region 22, and between neighboring fins 24. The experiment results are unexpected in that when fin height H is smaller than about 400 Å, height H' of the residues is substantially equal to 0 Å, and substantially no residue is left. When the fin height is greater than about 400 Å, however, height H' of the residues quickly rises.

Figure 9:
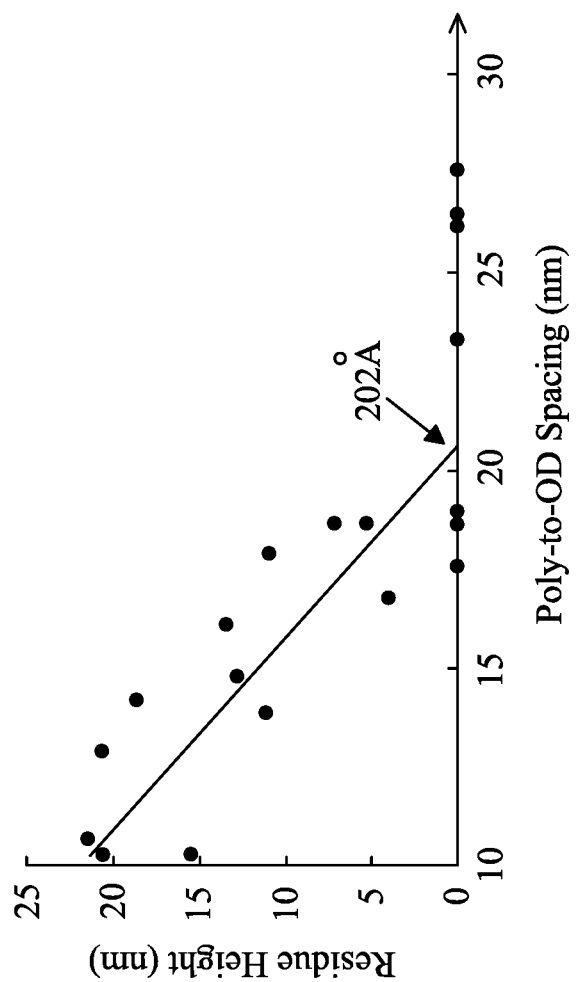

Experiment results also indicated that poly-to-OD spacing S1 (FIG. 6B) also has an effect on the amount of residue remaining in trench 45. FIG. 9 illustrates the experiment result obtained from sample wafers, and a fit line is made, wherein height H' (FIG. 6) of the residues in trench 45 is illustrated as a function of fin height H. The experiment results indicated that when poly-to-OD spacing S1 is greater than about 200 Å, height H' of the residues is substantially equal to 0 Å, and substantially no residue is left. Accordingly, in accordance with embodiments, poly-to-OD spacing S1 is greater than about 200 Å.

It is further appreciated that the width W of STI region 22 also has the effect on whether the residues will be formed or not. It is noted that width W is also the spacing of neighboring fins 24. In accordance with some embodiments, width W of STI region 22 may be smaller than about 100 Å. The aspect ratio H/W of trench 45 may be smaller than about 13, and may also be smaller than about 5.

Figure 6C:
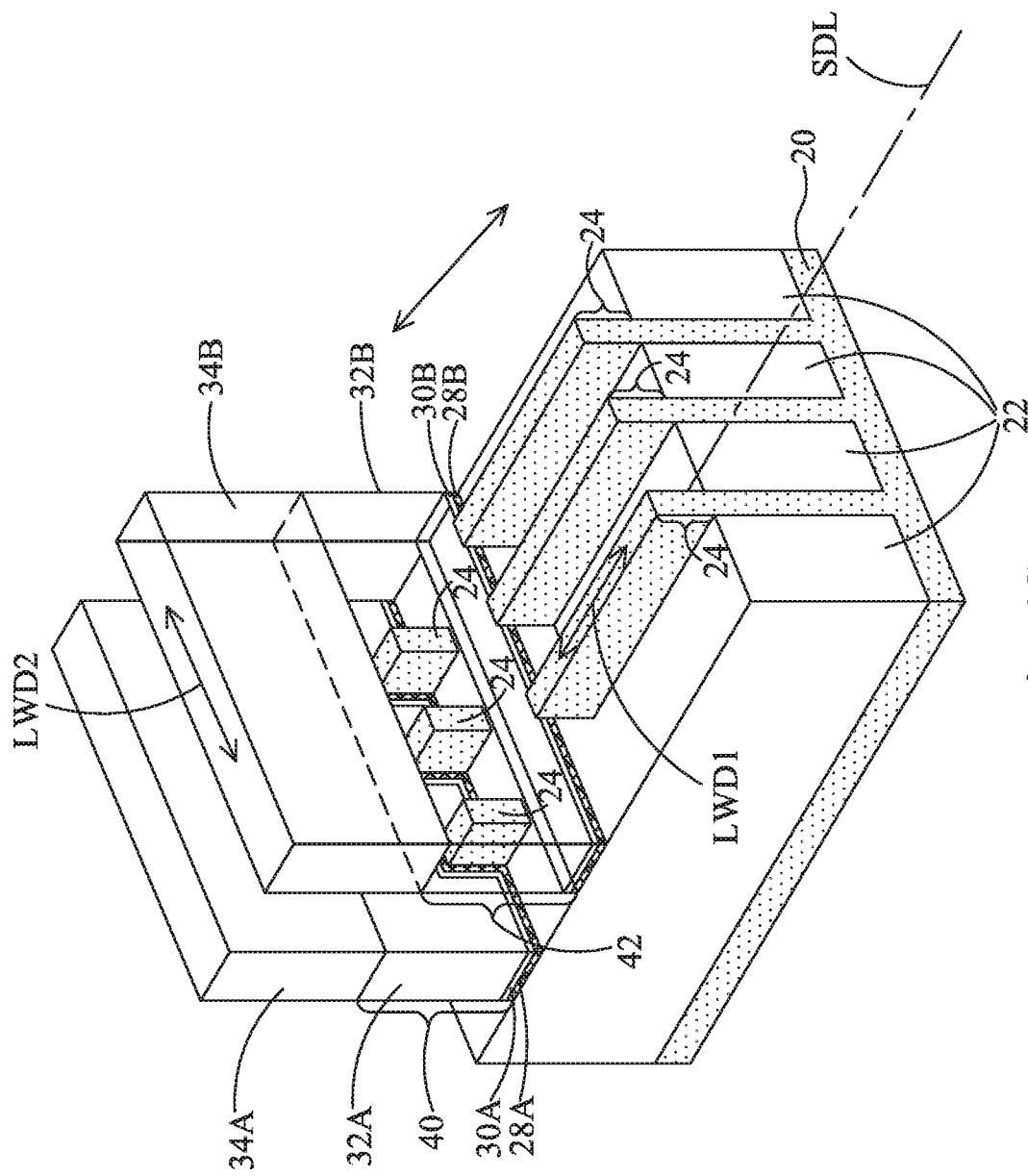

FIG. 6C illustrates a perspective view of the structure shown in FIG. 6A. For the structure that is behind polysilicon strip 32B to be shown clearly, polysilicon strip 32B is illustrated as transparent. FIG. 6C illustrates that gate stack 40 is over, and crosses, fin 24. Stacked layers 42 are between neighboring fins 24, and are spaced apart from fins 24. As shown in FIG. 6C, the two semiconductor fins 24 on the left of FIG. 6C are elongated, and have lengthwise directions, as marked as LWD1. The lengthwise directions of the two semiconductor fins 24 on the left are also aligned to straight line SDL. Stacked layers 42 are also elongated, and have a lengthwise direction marked as LWD2. Lengthwise direction LWD2 is perpendicular to lengthwise direction LWD1.

Figure 7:
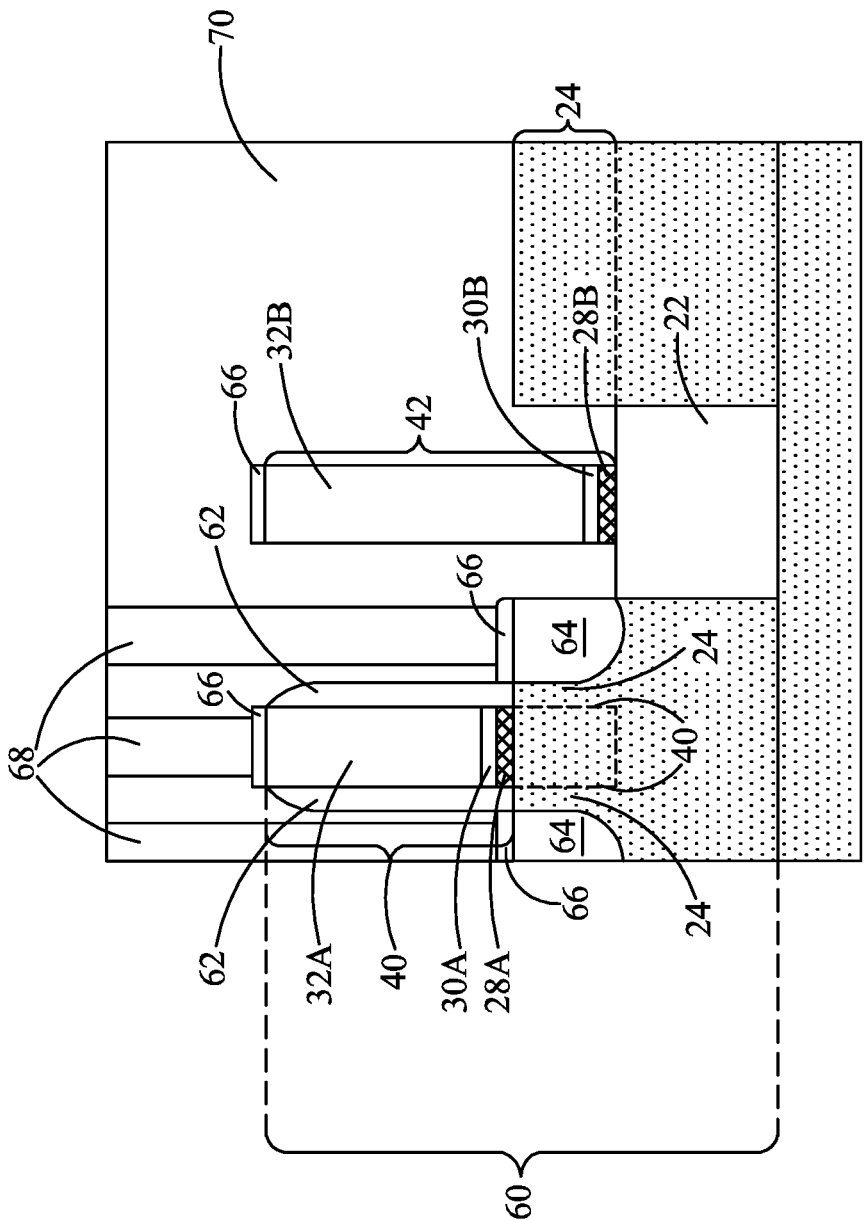

In a subsequent step, hard mask patterns 34A and 34B are removed, as shown in FIG. 7. In Subsequent steps, as also shown in FIG. 7, FinFET 60 is formed, wherein gate stack 40 acts as the gate stack of FinFET 60. Stacked layers 42 may act as a dummy pattern, which is electrically floating. Alternatively, stacked layers 42 may act as the electrical connection between devices. For example, stacked layers 42 may act as the electrically connection between the gates of two FinFETs (not shown).

FinFET 60 may include gate spacers 62, source and drain regions 64, silicide regions 66, contact plugs 68, and Inter-Layer Dielectric (ILD) 70. In some embodiments, the formation of source and drain regions 64 may also comprise etching portions of fin 24 that are not covered by gate stack 40, and performing an epitaxy to grow stressors (not shown, which may be silicon germanium or silicon carbon). The stressors are then implanted to form source/drain regions 64. In alternative embodiments, fin 24 is not recessed, and an epitaxy may be performed to grow an epitaxy region on fin 24 to enlarge source and drain regions 64. At the time source and drain regions 64 is formed by the implantation, stacked layers 42 may also be implanted to reduce the resistivity.

In accordance with embodiments, a device includes a substrate, an isolation region at a top surface of the substrate, and a semiconductor fin over the isolation region. The semiconductor fin has a fin height smaller than about 400 Å, wherein the fin height is measured from a top surface of the semiconductor fin to a top surface of the isolation region.

In accordance with other embodiments, a device includes a semiconductor substrate, STI regions adjacent to a surface of the semiconductor substrate, and a first and a second semiconductor strip comprising sidewalls contacting opposite sidewalls of the STI regions. The device further includes a first and a second semiconductor fin over and joining the first and the second semiconductor strips, respectively. The fin heights of the first and the second semiconductor fins are smaller than about 400 Å.

In accordance with yet other embodiments, a method includes forming an STI region in a semiconductor substrate, wherein portions of the semiconductor substrate on opposite sides of the STI region form semiconductor strips. The method further includes recessing the STI region to form a recess. The top portions of the semiconductor strips form a first and a second semiconductor fin having fin heights smaller than about 400 Å, wherein the fin heights are measured from top surfaces of the first and the second semiconductor fins to a top surface of the STI region.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
forming a first and a second semiconductor fin protruding over top surfaces of shallow trench isolation regions, wherein the shallow trench isolation regions extend to opposite sides of the first and the second semiconductor fins, and first lengthwise directions of the first and the second semiconductor fins are co-linear with each other with the first lengthwise directions in long sides of the first and the second semiconductor fins;
forming a dielectric layer extending on sidewalls and top surfaces of the first and the second semiconductor fins, wherein the dielectric layer further extends over a top surface of an intermediate portion of the shallow trench isolation regions, with the intermediate portion being between the first and the second semiconductor fins;
forming a capping layer over the dielectric layer;
forming a polysilicon layer over the capping layer; and
patterning the dielectric layer, the capping layer, and the polysilicon layer to form a first gate stack and a second gate stack having second lengthwise directions parallel to each other and perpendicular to the first lengthwise directions, wherein the first gate stack extends on the sidewalls and the top surface of the first semiconductor fin, and the second gate stack is directly over the intermediate portion of the shallow trench isolation regions.

2. The method of claim 1, wherein after the patterning, the dielectric layer does not comprise portions connecting the second gate stack to either one of the first and the second semiconductor fins.

3. The method of claim 1, wherein the first semiconductor fin has a fin height smaller than about 400 Å, and the fin height is measured from a top surface of the first semiconductor fin to a top surface of the shallow trench isolation regions.

4. The method of claim 3, wherein after the patterning, no residues of the dielectric layer, the capping layer, and the polysilicon layer are left to connect the substantially vertical sidewalls to any of the first and the second semiconductor fins.

5. The method of claim 1, wherein the forming the capping layer comprises forming a metal-containing layer.

6. The method of claim 1 further comprising forming a Fin Field-Effect Transistor (FinFET) based on the first semiconductor fin.

7. A method comprising:
forming a first and a second semiconductor fin protruding over top surfaces of shallow trench isolation regions, wherein the shallow trench isolation regions extend to opposite sides of the first and the second semiconductor fins, and first lengthwise directions of the first and the second semiconductor fins are aligned to a straight line with the first lengthwise directions in long sides of the first and the second semiconductor fins;
forming a dielectric layer extending on sidewalls and top surfaces of the first and the second semiconductor fins, wherein the dielectric layer further extends over a top surface of an intermediate portion of the shallow trench isolation regions, with the intermediate portion being between the first and the second semiconductor fins, with sidewalls of the intermediate portion vertically aligned to respective sidewalls of the first and the second semiconductor fins;
forming a capping layer over the dielectric layer;
forming a polysilicon layer over the capping layer; and
patterning the dielectric layer, the capping layer, and the polysilicon layer to form a first gate stack having a second lengthwise direction perpendicular to the first lengthwise directions.

8. The method of claim 7, wherein the dielectric layer, the capping layer, and the polysilicon layer comprise sidewall portions on sidewalls of the first and the second semiconductor fins, and the sidewall portions comprise a first portion on an end sidewall of the first semiconductor fin, and a second portion on an end sidewall of the second semiconductor fin, with the first portion and the second portion overlapping the intermediate portion of the shallow trench isolation regions, and wherein after the patterning, the first portion and the second portion are removed.

9. The method of claim 7, wherein the patterning further forms a second gate stack overlapping the intermediate portion of the shallow trench isolation regions.

10. The method of claim 9, wherein the second gate stack has a lengthwise direction parallel to the second lengthwise direction, with the lengthwise direction of the second gate stack in a long side of the second gate stack.

11. The method of claim 9, wherein after the patterning, no residues of the dielectric layer, the capping layer, and the polysilicon layer are left to connect the second gate stack to any of the first and the second semiconductor fins.

12. The method of claim 7, wherein the forming the capping layer comprises forming a metal-containing layer.

13. The method of claim 7 further comprising forming a Fin Field-Effect Transistor (FinFET) based on the first semiconductor fin.

14. A method comprising:
forming a Shallow Trench Isolation (STI) region in a semiconductor substrate, wherein portions of the semiconductor substrate on opposite sides of the STI region form semiconductor strips; and
recessing the STI region to form a recess, wherein top portions of the semiconductor strips form a first and a second semiconductor fin having fin heights smaller than about 400 Å, wherein the first and the second semiconductor fins are separated from each other by an intermediate portion of the STI region, and lengthwise directions of the first and the second semiconductor fins are co-linear with each other, with the lengthwise directions being along long sides of the first and the second semiconductor fins, and wherein the fin heights are measured from top surfaces of the first and the second semiconductor fins to a top surface of the STI region.

15. The method of claim 14 further comprising:
forming a gate dielectric layer over the STI region and the first and the second semiconductor fins;
forming a metal layer over the gate dielectric layer;
forming a polysilicon layer over the metal layer; and
patterning the polysilicon layer, the metal layer, and the gate dielectric layer to form a first gate stack on a top surface and sidewalls of the first semiconductor fin, and a second gate stack overlapping an intermediate portion of the STI region between the first and the second semiconductor fins.

16. The method of claim 15, wherein after the patterning, no residues of the polysilicon layer, the metal layer, and the gate dielectric layer are left over the STI region and connecting the second gate stack to any of the first and the second semiconductor fins, and wherein respective edges of the polysilicon layer, the metal layer, and the gate dielectric layer are aligned with each other.

17. The method of claim 15, wherein the second gate stack does not contact the first and the second semiconductor fins.

18. The method of claim 14, wherein a distance between the first and the second semiconductor fins smaller than about 500 Å, and a ratio of one of the fin heights of the first and the second semiconductor fins to the distance is smaller than about 13 and greater than 0.

19. The method of claim 14, wherein sidewalls of the intermediate portion of the STI region are vertically aligned to respective sidewalls of the first and the second semiconductor fins.

20. The method of claim 14 further comprising forming a Fin Field-Effect Transistor (FinFET) based on the first semiconductor fin.

\* \* \* \* \*